(12) United States Patent
Mandal et al.

(10) Patent No.: US 6,566,903 B1
(45) Date of Patent: May 20, 2003

(54) METHOD AND APPARATUS FOR DYNAMICALLY CONTROLLING THE PERFORMANCE OF BUFFERS UNDER DIFFERENT PERFORMANCE CONDITIONS

(75) Inventors: Subrata Mandal, Orangevale, CA (US); Mirza Jahan, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/474,047

(22) Filed: Dec. 28, 1999

(51) Int. Cl.[7] .................... H03K 17/16; H03K 19/003; H03H 11/26
(52) U.S. Cl. ...................... 326/30; 326/26; 327/281
(58) Field of Search ................ 326/30, 83, 86, 326/26; 710/105, 107; 327/262, 270, 281, 280

(56) References Cited

U.S. PATENT DOCUMENTS

| | | | | |
|---|---|---|---|---|
| 5,254,883 A | * | 10/1993 | Horowitz et al. | 326/30 |
| 5,712,582 A | * | 1/1998 | Yokota et al. | 327/156 |
| 6,009,487 A | * | 12/1999 | Davis et al. | 710/105 |
| 6,072,747 A | * | 6/2000 | Yoon | 365/230.06 |
| 6,268,753 B1 | * | 7/2001 | Sandusky | 327/266 |

* cited by examiner

Primary Examiner—Daniel D. Chang
(74) Attorney, Agent, or Firm—Blakely, Sokoloff, Taylor & Zafman LLP

(57) ABSTRACT

According to one aspect of the invention, a method is provided in which an input signal is received at a first node of a buffer circuit. The propagation of the input signal from the first node to a second node in the buffer circuit is delayed by a delay period based upon a first control input. The delay period is adjusted by a factor based upon a second control input.

24 Claims, 7 Drawing Sheets

METHOD AND APPARATUS FOR DYNAMICALLY CONTROLLING THE PERFORMANCE OF BUFFERS UNDER DIFFERENT PERFORMANCE CONDITIONS

FIELD OF THE INVENTION

The present invention relates to performance control of integrated circuits. More specifically, the present invention relates to an apparatus, method, and system for dynamically controlling the performance of buffer circuits under different performance conditions.

BACKGROUND OF THE INVENTION

Buffer circuits, for example input/output (I/O) buffers are widely used to facilitate the transfer of data and signals from one component or circuit to another component or circuit within a given system. As an example, a processor unit such as a microprocessor may contain a buffer unit that is used to transmit data to and receive data from other components such as memory components or chipset units via buses. Accordingly, the performance of the buffer unit directly affects the performance of the system component and the system as a whole since the speed of data transfer between the different components in the system is one of the factors in measuring the overall performance of any given system or circuitry.

The performance of a buffer circuit or an electronic component can vary based upon variations in the performance conditions or parameters including variations in manufacturing process, operating voltage, and operating temperature, etc. In general, some of the performance characteristics of the buffer circuit or the electronic component that may change due to variations in the operating conditions and process include the clock to output time, input drive current, and output drive current, etc. The term "fast" corner or "FFFF" corner is used to refer to the operation of the buffer circuit at its fastest, strongest performance. The term "slow" or "RSSS" corner is used to refer to the operation of the buffer circuit at its slowest, weakest performance.

Some of the parameters that are used to measure the performance of a buffer circuit are the "TCO_MIN" and "TCO_MAX". TCO_MIN is defined as the minimum clock to output time or the time required in the FFFF corner for a signal to move to the output of the final driver in the buffer with reference to the clock edge which latches the signal into the buffer. The TCO_MAX is defined as the maximum clock to output time or the time required in the RSSS corner for a signal to move to the output of the final driver in the buffer with reference to the clock edge which latches the signal into the buffer. To increase the speed and thus the overall performance of a buffer circuit, the designer would want to design the buffer with high TCO_MIN and low TCO_MAX in order to satisfy the timing equations including the setup equation and the hold margin equation. However, the development of buffer circuits has been limited by the fact that TCOMIN and TCOMAX could not be improved simultaneously on the same design because to improve either of them deteriorate the other. As mentioned above, the RSSS corner and the FFFF corner are the extreme corners in the design simulation. The buffer circuits tend to be slow in the RSSS corner thus making it difficult for the setup equation to be satisfied. In the FFFF corner, however, the buffer circuits can be too fast to satisfy the hold margin equation.

SUMMARY OF THE INVENTION

According to one aspect of the invention, a method is provided in which an input signal is received at a first node of a buffer circuit. The propagation of the input signal from the first node to a second node in the buffer circuit is delayed by a delay period based upon a first control input. The delay period is adjusted by a factor based upon a second control input.

BRIEF DESCRIPTION OF THE DRAWINGS

The features and advantages of the present invention will be more fully understood by reference to the accompanying drawings, in which.

DETAILED DESCRIPTION

In the following detailed description numerous specific details are set forth in order to provide a thorough understanding of the present invention. However, it will be appreciated by one skilled in the art that the present invention may be understood and practiced without these specific details.

In the discussion below, the teachings of the present invention are utilized to implement a method and apparatus for dynamically adjusting the performance of a buffer circuit under varying performance conditions. In one embodiment, a plurality of parallel signal paths of different sizes are coupled between a first node and a second node in the buffer circuit. Each signal path is activated or deactivated based upon the value of a control signal that corresponds to variations in the performance conditions of the buffer circuit. The input of each signal path is coupled to receive an input signal at the first node and the output of each signal path is coupled to the second node. Each signal path, when activated, allows a corresponding current level of the input signal that is proportional of the size of the respective signal path to flow from the first node to the second node through the respective activated signal path. The teachings of the present invention are applicable to any scheme, method and system for performance control and/or improvement of buffers. However, the present invention is not limited to buffer circuits and can be applied to other circuits, components, or systems.

Figure 1:
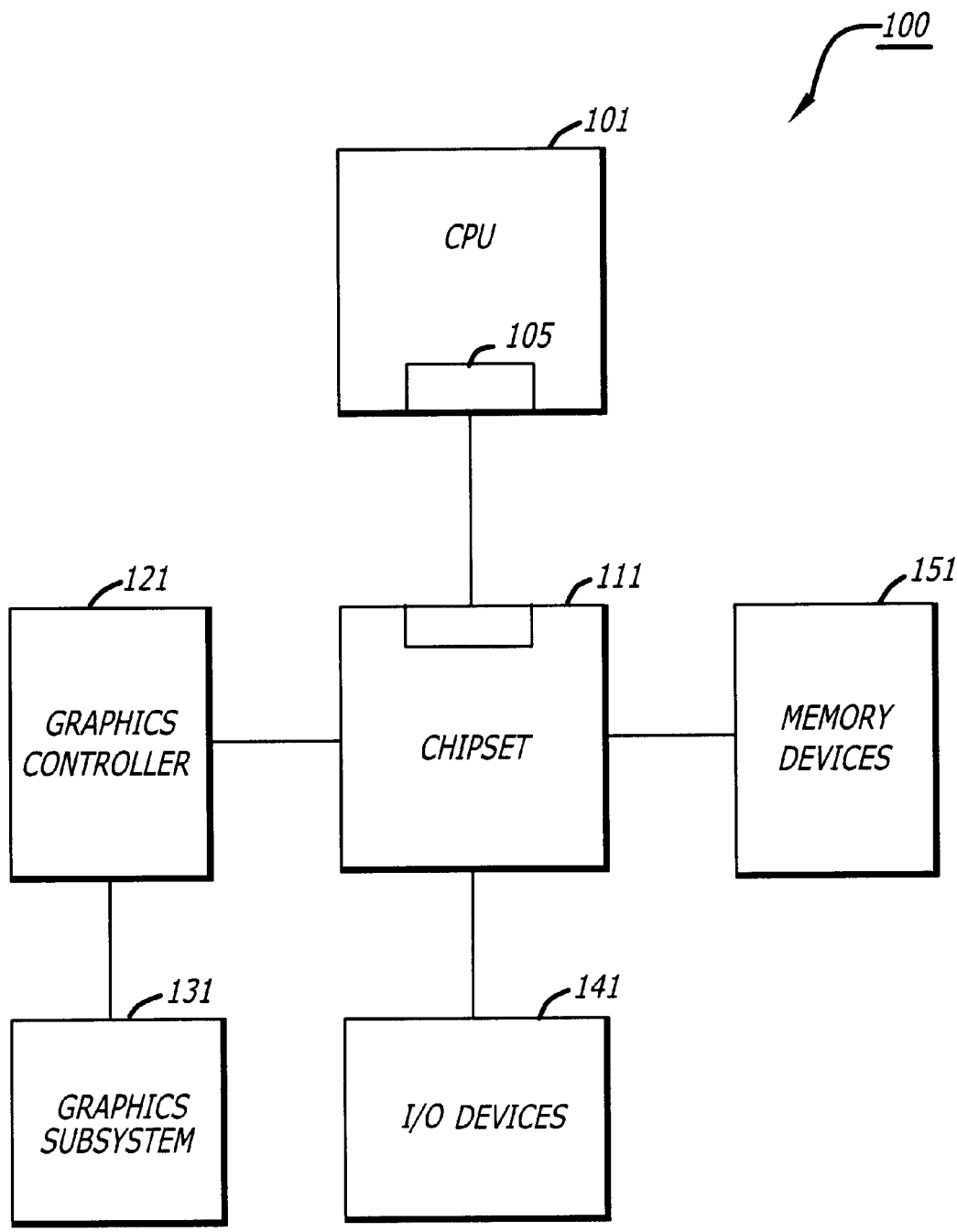
FIG. 1 is a block diagram of one embodiment of a system implementing the teachings of the present invention.

FIG. 1 shows a block diagram of one embodiment of a system configuration 100 in which the teachings of the present invention are implemented. The system configuration 100 includes a central processing unit (CPU) 101, a chipset unit 111, a graphics controller 121 coupled to a graphics subsystem 131, I/O devices 141, and a plurality of memory devices 151. For the purposes of the present specification, the term "processor" or "CPU" refers to any machine that is capable of executing a sequence of instructions and shall be taken to include, but not be limited to, general purpose microprocessors, special purpose microprocessors, multi-media controllers and microcontrollers, etc. In one embodiment, the CPU 101 is a general-purpose microprocessor that is capable of executing an Intel Architecture instruction set. The CPU 101 includes a buffer unit 105 that is used to facilitate data transfer between the CPU 101 and other components such as the chip set 111. In one embodiment, the chipset 111 may include a memory control unit (not shown) that is responsible for servicing memory transactions that target the system memory devices 151. In another embodiment, the memory control unit can be a stand-alone unit, or an integrated part of some larger unit that control the interface between various system components and the system memory devices 151. In one embodiment, the chipset unit 111 may also include an I/O control unit (not shown) that provides the interface control between the memory unit control unit and various I/O devices 141 including PCI slots, PCI agents, a plurality of USB ports, a plurality of IDE ports, and other IO devices. The AGP graphics control unit 121 provides the interface control between the graphics subsystem 131 and the chip set unit 111.

Figure 2:
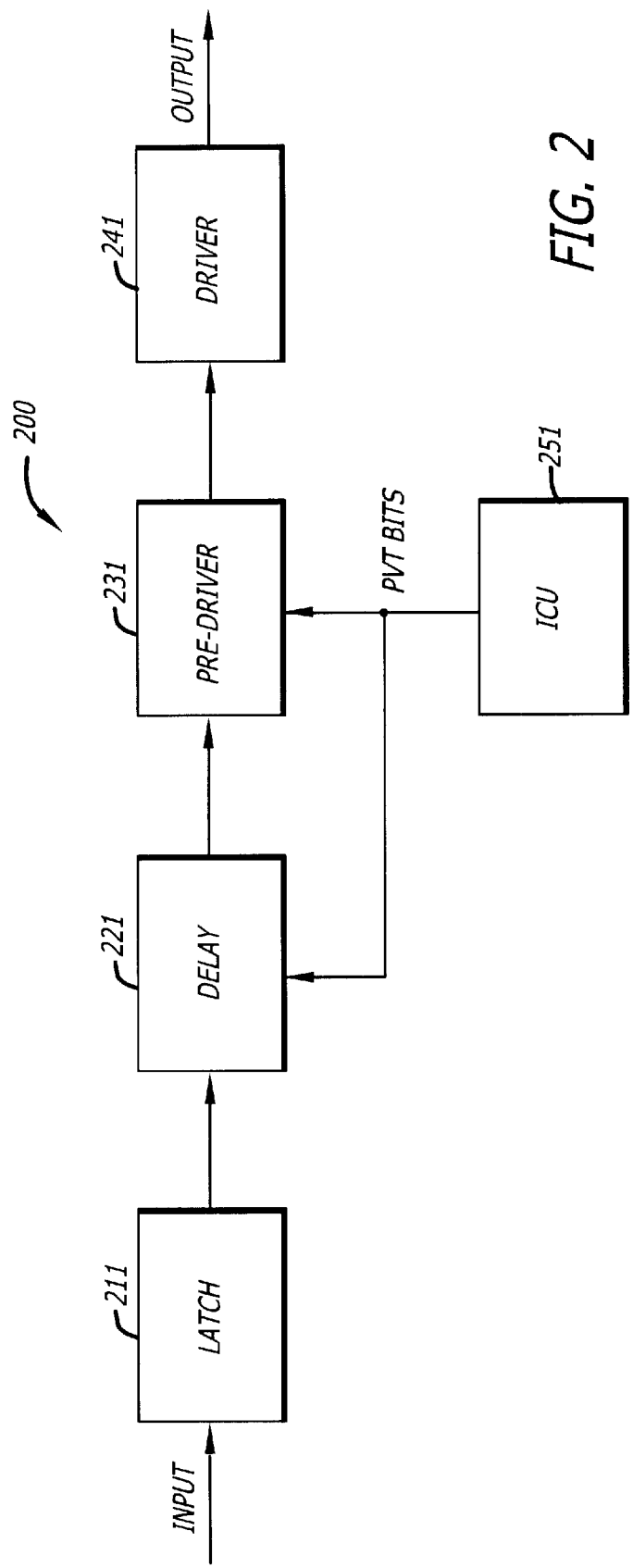
FIG. 2 shows a block diagram of one embodiment of a buffer circuit according to the teachings of the present invention.

FIG. 2 illustrates a block diagram of one embodiment 200 of the buffer unit 105 shown in FIG. 1. The buffer unit 200 includes a latch unit 211, a delay unit 221, a pre-driver unit 231, and a driver unit 241. The latch 211, in one embodiment, coupled to receive an input signal or data and latch the input signal or data in response to a bus clock signal (not shown). The delay unit 221 receives the input signal from the latch unit 211 and adjustably delays the propagation of the signal for a corresponding period of time based upon a first control input that corresponds to a desired delay period and a second control input that corresponds to variations of the performance conditions. The structure and operations of the delay unit 221 are described in more detail below. The pre-driver unit 231 is coupled to the delay unit 221 to strengthen the input signal. The driver unit 241 drives the input signal to the output node 291.

Figure 3:
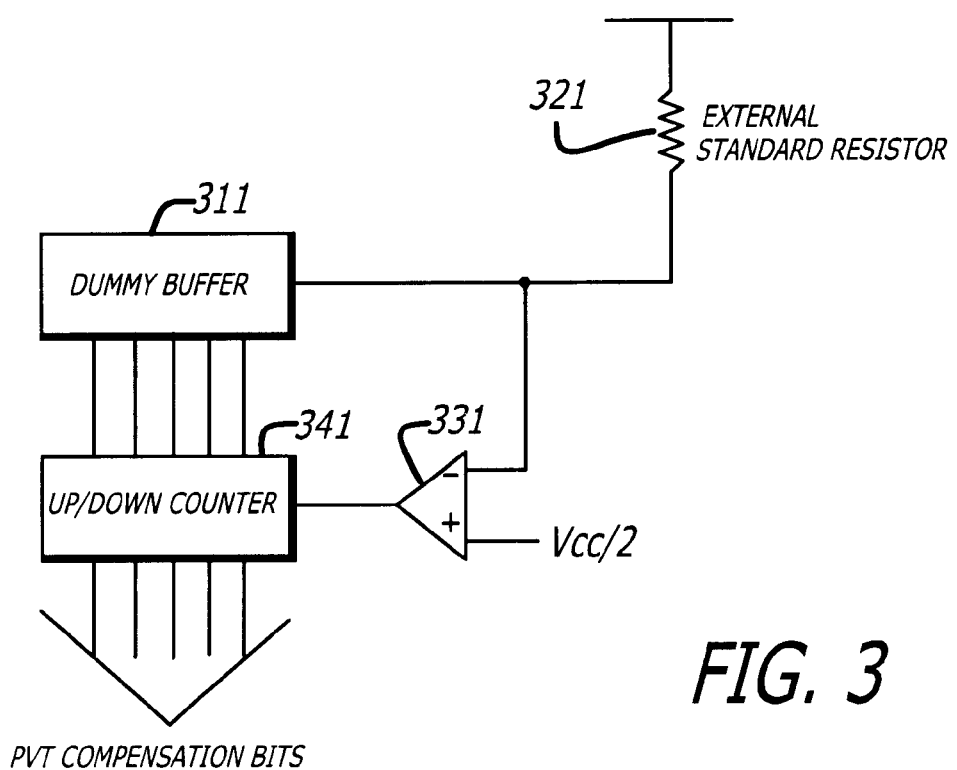
FIG. 3 illustrates a block a diagram of one embodiment of an impedance control unit (ICU)

In one embodiment, the second control input is generated by an impedance control unit (ICU) 251 by well-known techniques and contains five compensation bits that are used to compensate for variations of various performance conditions including variations in manufacturing process, operating voltage, and operating temperature (also referred to as PVT compensation bits or PVT bits herein). A more detailed block diagram of one embodiment of the ICU 251 is illustrated in FIG. 3. As shown in FIG. 3, the ICU 251 includes a dummy buffer 311, a high precision external resistor 321, a comparator 331, and a five-bit up/down counter 341. Functionally, the ICU compares the impedance of the dummy buffer 311 against the high precision resistor 321 to generate the five compensation bits. These bits turn the transistors in the multi-leg dummy buffer on or off in order to make the impedance of the dummy buffer equal to the external high precision resistor under different variations of the manufacturing process, operating voltage and operating temperature (PVT) conditions. Thus the five compensations bits generated by the ICU are a function of manufacturing process, operating voltage, and operating temperature. In one embodiment, the compensation bits are 01000 (decimal 8) in the FFFF corner and 10000 (decimal 16) in the RSSS corner. For other corners, the value of the compensation bits are in between 01000 (decimal 8) and 10000 (decimal 16).

Figure 4:
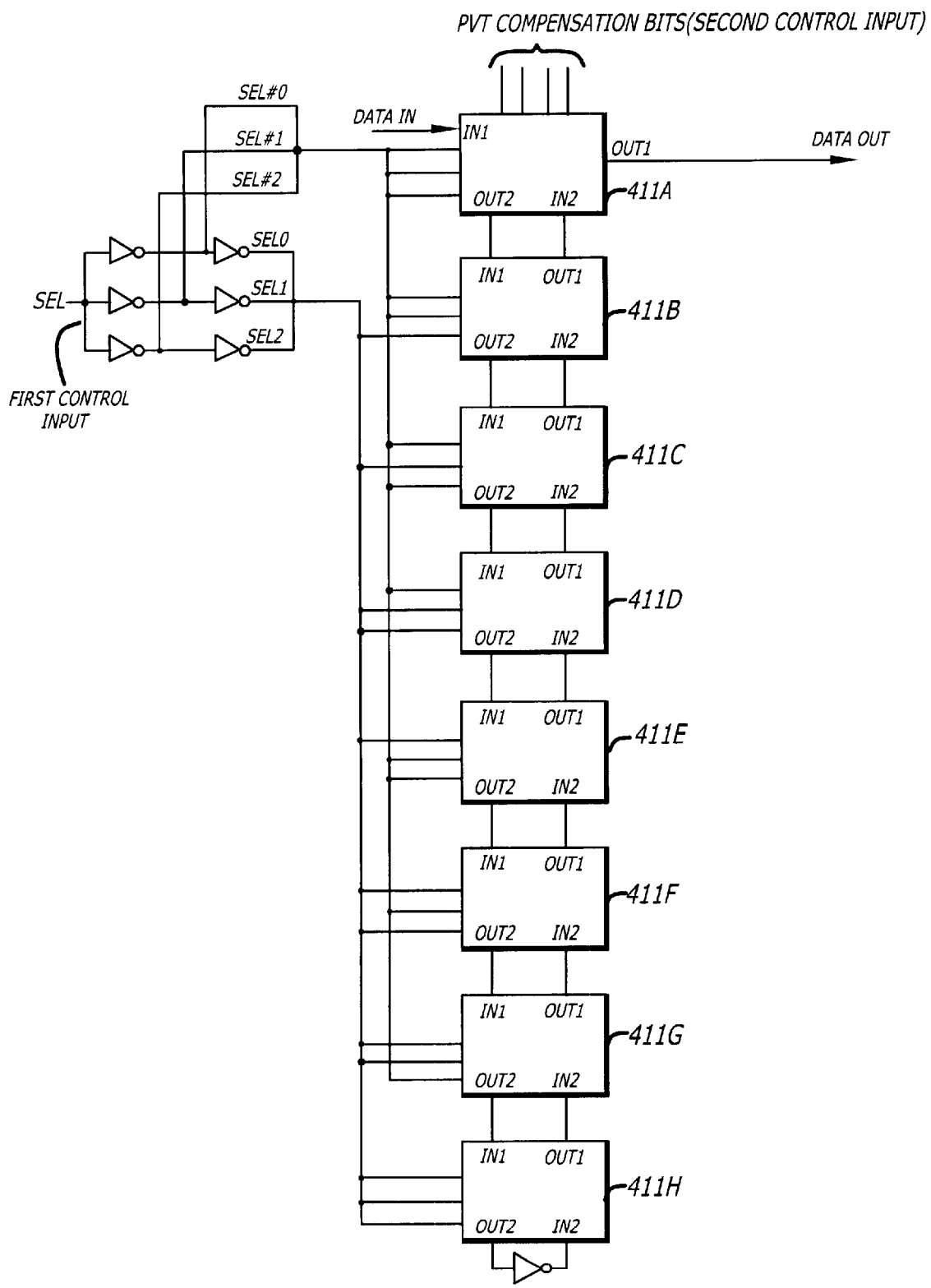
FIG. 4 shows a block diagram of one embodiment of a delay unit according to the teachings of the present invention.

FIG. 4 shows a block diagram of one embodiment of the delay unit 221 described in FIG. 2. In one embodiment, the delay unit 221 as shown in FIG. 4 includes 8 delay stages each of which is activated or deactivated (e.g., connected to or disconnected from the next delay stage) based upon the value of the first control input. It should be appreciated by one skilled in the art, however, that the teachings of the present invention are not limited to the delay unit shown in FIG. 4 and are equally applicable to delay units having different number of delay stages. Moreover, the teachings of the present invention are not limited to delay units used in buffer circuit and can also be applied to other types of circuits, components, or systems in which the timing of signal transfer from one node to another node is to be dynamically adjusted to compensate for variations in different performance conditions including variations in manufacturing process, operating voltage, and operating temperature. In addition, it should be understood and appreciated by one skilled in the art that the teachings of the present invention are not limited to PVT compensation and can include compensation for variations in other performance conditions beside process, voltage, and temperature.

Referring again to FIG. 4, the delay unit 221 includes a plurality of delay stages 411A–H that are coupled in series. Each of the delay stages 411A–H has two input nodes IN1 and IN2 and two output nodes OUT1 and OUT2. The input node IN1 of the first delay stage 411A is coupled to receive the input signal from the latch 211. The output node OUT1 of the first delay stage 411A is coupled to transmit the input signal to the pre-driver unit 231. The output node OUT2 of each delay stage 411A–411G is coupled to the input node IN1 of each delay stage 411B–411H, respectively. The input node IN2 of each delay stage 411A–411G is coupled to the output node OUT1 of each delay stage 411B–411H, respectively. The output node OUT2 and input node IN2 of the last stage 411H are coupled via an inverter. Each of the delay stages 411A–411H is coupled to receive the first control input corresponding to a desired delay period of the input signal. In one embodiment, the first control input includes three selection bits that are used to select a corresponding number of delay stages through which the input signal is to be routed. It should be appreciated that the first control input can contain a different number of selection bits so long as the number of selection bits is sufficient to activate each delay stage 411A–411H. In one embodiment, each of the selection bits can be set to a first value (e.g., 0) or a second value (e.g., 1) in order to select a specific number of delay stages through which the input signal is to be routed. The table below illustrates the specific delay stages and the total number of delay stages that are selected based upon the value of the first control input that has three selection bits. In the table below, for purposes of illustration and explanation only, bit-2 is used to referred to the most significant bit of the first control input and bit-0 is used to referred to the least significant bit of the first control input.

| Bit 2 | Bit 1 | Bit 0 | Delay Stage 1 | Delay Stage 2 | Delay Stage 3 | Delay Stage 4 | Delay Stage 5 | Delay Stage 6 | Delay Stage 7 | Delay Stage 8 | # Stages selected |
|---|---|---|---|---|---|---|---|---|---|---|---|
| 0 | 0 | 0 | ON | OFF | OFF | OFF | OFF | OFF | OFF | OFF | 1 |
| 0 | 0 | 1 | ON | ON | OFF | OFF | OFF | OFF | OFF | OFF | 2 |
| 0 | 1 | 0 | ON | ON | ON | OFF | OFF | OFF | OFF | OFF | 3 |
| 0 | 1 | 1 | ON | ON | ON | ON | OFF | OFF | OFF | OFF | 4 |
| 1 | 0 | 0 | ON | ON | ON | ON | ON | OFF | OFF | OFF | 5 |
| 1 | 0 | 1 | ON | ON | ON | ON | ON | ON | OFF | OFF | 6 |
| 1 | 1 | 0 | ON | ON | ON | ON | ON | ON | ON | OFF | 7 |
| 1 | 1 | 1 | ON | ON | ON | ON | ON | ON | ON | ON | 8 |

It can be appreciated by one skilled in the art that other orderings of the control bits of the first control input can also be used to selectively activate a different number of delay stages through which the input signal is to be routed.

Continuing with the present discussion, to satisfy the requirement of the timing equations (e.g., setup and hold), a different number of delay stages in the delay circuit 400 can be selected by specifying a different value of the first control input. For example, when the value of the first control input is set to "000", the input signal is routted through the first delay stage 411A only. More specifically, the input signal is imputted to the first delay stage 411A at the input node IN1 and routed to the output node OUT1 of the first delay stage 411A. When the value of the first control input is set to "001", the input signal moves from the input IN1 to the output node OUT2 in the first delay stage 411A. The input signal then enters the second delay stage 411B through the input node IN1 and comes out of the second delay stage 411B through the output node OUT 1. The input signal then reenters the first delay stage 411A through its second input node IN2 and comes out of the first delay stage 411A through its first output node OUT1. When the value of the first control input is set to "010", the routing path of the input signal is as follows:

IN1 of 411A to OUT2 of 411A to IN1 of 411B to OUT2 of 411B to IN1 of 411C to OUT1 of 411C to IN2 of 411B to OUT1 of 411B to IN2 of 411A to OUT1 of 411A.

Similar routing process of the input signal takes place when the fourth delay stage 411D—the eighth delay stage 411H are selected. It can be appreciated that by controlling the value of the first control input, a different delay of the input signal can be accomplished by routing the input signal through a different number of delay stages. In this example, the greater number of delay stages through which the input signal is to be routed, the longer the distance the input signal travels and thus a longer delay for input signal to get from the input node of the delay circuit 221 (e.g., the input node IN1 of the first delay stage 411A) to the output node of the delay circuit 221 (e.g., the output node OUT1 of the first delay stage 411A).

As shown in FIG. 4, the first delay stage 411A is used to adjust the delay specified by the first control input using the second control input which contains information corresponding to variations in the performance conditions. More specifically, the first delay stage 411A, in this embodiment, is used to dynamically adjust the delay specified by the first control input based upon the value of the second control input to compensate for variations in the performance conditions of the buffer circuit (e.g., manufacturing process, operating voltage, and operating temperature). In this embodiment, as described above, regardless of the number of delay stages selected as specified by the value of the first control input, the input signal will be routed through the first stage which is PVT compensated based upon the value of the second control input. Thus the propagation speed of the input signal through the buffer circuit can be dynamically adjusted to compensate for variations in the performance conditions of the buffer circuit. The structure and operations of the PVT compensated first delay stage 411A are described in more detail below.

Figure 5:
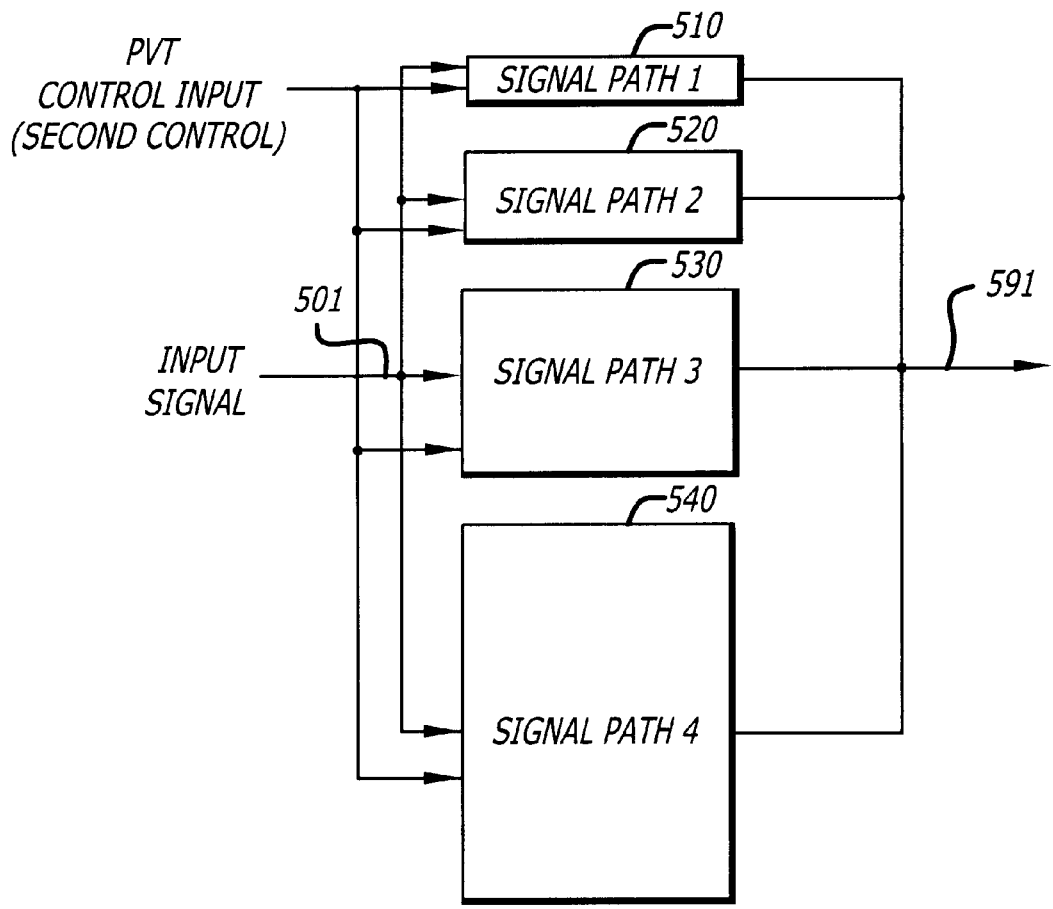
FIG. 5 shows a block diagram of one embodiment of a delay stage used to compensate for variations in a buffer's performance conditions.

FIG. 5 shows a block diagram of one embodiment 500 of the first delay stage 411A described in FIG. 4. In this embodiment, the first delay stage 411A includes a plurality of parallel signal paths each having a different size (e.g., channel width) and each of which can be activated to route a corresponding amount of current of the input signal from the input node 501 to the output node 591. It should be understood and appreciated by one skilled in the art that the number of signal paths shown in FIG. 5 is for purposes of illustration and explanation only and that this number can vary in other implementations and applications. In this embodiment, the number of parallel signal paths corresponds to the number of control bits that are included in the second control input. In one embodiment, the value of each control bit of the second control input is used to determine whether a particular path is to be activated. Since the size of each path is different, the amount of current of the input signal that is allowed to pass through each activated signal path is also different. In other words, the amount of current that is allowed to pass through each activated signal path is proportional to the size of the respective signal path. Thus, in this embodiment, the amount of current allowed to pass through the first signal path 510 is less than the amount of current allowed to pass through the second signal path 520 which is less than the amount of current allowed to pass through the third signal path 530 which is less than the amount of current allowed to pass through the fourth signal path 540. In one embodiment, each signal path 510–540 may be activated or deactivated based upon the value of the second control input. In one embodiment, each control bit in the second control input can be used to activate or deactivate a corresponding signal path shown in FIG. 5. In this embodiment, the first bit of the second control input is used to activate the first signal path 510, the second bit of the second control input is used to activate the second signal path 520, the third bit of the second control input is used to activate the third signal path 530 and the fourth bit is used to activate the fourth signal pass 540. The various combinations of the values of the second control input and the corresponding signal paths are shown in the table below:

| Bit4 (MSB) | Bit3 | Bit2 | Bit1 | Bit0 (LSB) not used | Signal Path 4 | Signal Path 3 | Signal Path 2 | Signal Path 1 | Signal Path 0 |
|---|---|---|---|---|---|---|---|---|---|
| 0 | 0 | 0 | 0 | 0 | X | X | X | X | X |
| 0 | 1 | 0 | 0 | 0 | OFF | ON | OFF | OFF | X |
| 0 | 1 | 0 | 0 | 1 | OFF | ON | OFF | OFF | X |
| 0 | 1 | 0 | 1 | 0 | OFF | ON | OFF | ON | X |
| 0 | 1 | 0 | 1 | 1 | OFF | ON | OFF | ON | X |
| 0 | 1 | 1 | 0 | 0 | OFF | ON | ON | OFF | X |
| 0 | 1 | 1 | 0 | 1 | OFF | ON | ON | OFF | X |
| 0 | 1 | 1 | 1 | 0 | OFF | ON | ON | ON | X |
| 0 | 1 | 1 | 1 | 1 | OFF | ON | ON | ON | X |
| 1 | 0 | 0 | 0 | 0 | ON | OFF | OFF | OFF | X |
| 1 | 0 | 0 | 0 | 1 | X | X | X | X | X |

As shown in FIG. 5, the delay stage 411A contains four parallel signal paths 510, 520, 530, and 540. The input node of each signal path 510, 520, 530, and 540 is coupled to the input signal received at node 501. The output node of each signal path is coupled to the output node 591. In this embodiment, each signal path is coupled to a corresponding control bit of the second control input that is used to activate the respective signal path. In particular, the signal path 510 is coupled to bit-1 of the second control input. The signal path 520 is coupled to bit-2 of the second control input. The signal path 530 is coupled to bit-3 of the second control input. The signal path 540 is coupled to bit-4 of the second control input. In this embodiment, each signal path is activated or deactivated based upon the value of the corresponding control bit coupled to the respective signal path. In one embodiment, each signal path is activated if the corresponding control bit is set to a first value (e.g., 1) and deactivated if the corresponding control bit is set to a second value (e.g., 0). In one embodiment, the signal paths are binary weighted so that the signal path 540 is the fastest path and the signal path 510 is the slowest path. Specifically, the size of the signal path 520 is approximately twice the size of the signal path 510; the size of the signal path 530 is approximately twice the size of the signal path 520; and the size of the signal path 540 is approximately twice the size of the signal path 530. Each signal path, when activated, allows a proportional amount of current of the input signal to flow from the input node 501 to the output node 591 through the respective signal path. Accordingly, the amount of current that is allowed to flow through the fastest signal path 540 is about twice the amount of current allowed to flow through the signal path 530; four times the amount of current allowed to flow through the signal path 520; and about sixteen times the amount of current allowed to flow through the slowest signal path 510. It can be appreciated that, by controlling the amount of current flowing through each signal path based upon the value of the control bits, the amount of current flowing from the input node 501 to the output node 591 can be varied to compensate for the variations in the performance conditions as indicated by the control bits. As a result, the speed of signal transfer from the input node 501 to the output node 591 can be dynamically controlled through the appropriate settings of the control bits. For example, in one embodiment, the bit combination is set to 01000 (LSB) in the FFFF corner which will activate the signal path 530 and set to 10000 (LSB) in the RSSS corner which will activate the signal path 540. Accordingly, in the FFFF corner the signal will move slower and conversely in the RSSS corner the signal will move faster through the first delay stage 411A. Thus it can be seen that by using the PVT compensated delay stage 411A, the speed of the buffer can be dynamically controlled so that it will work faster in the RSSS corner and slower in the FFFF corner.

Figure 6:
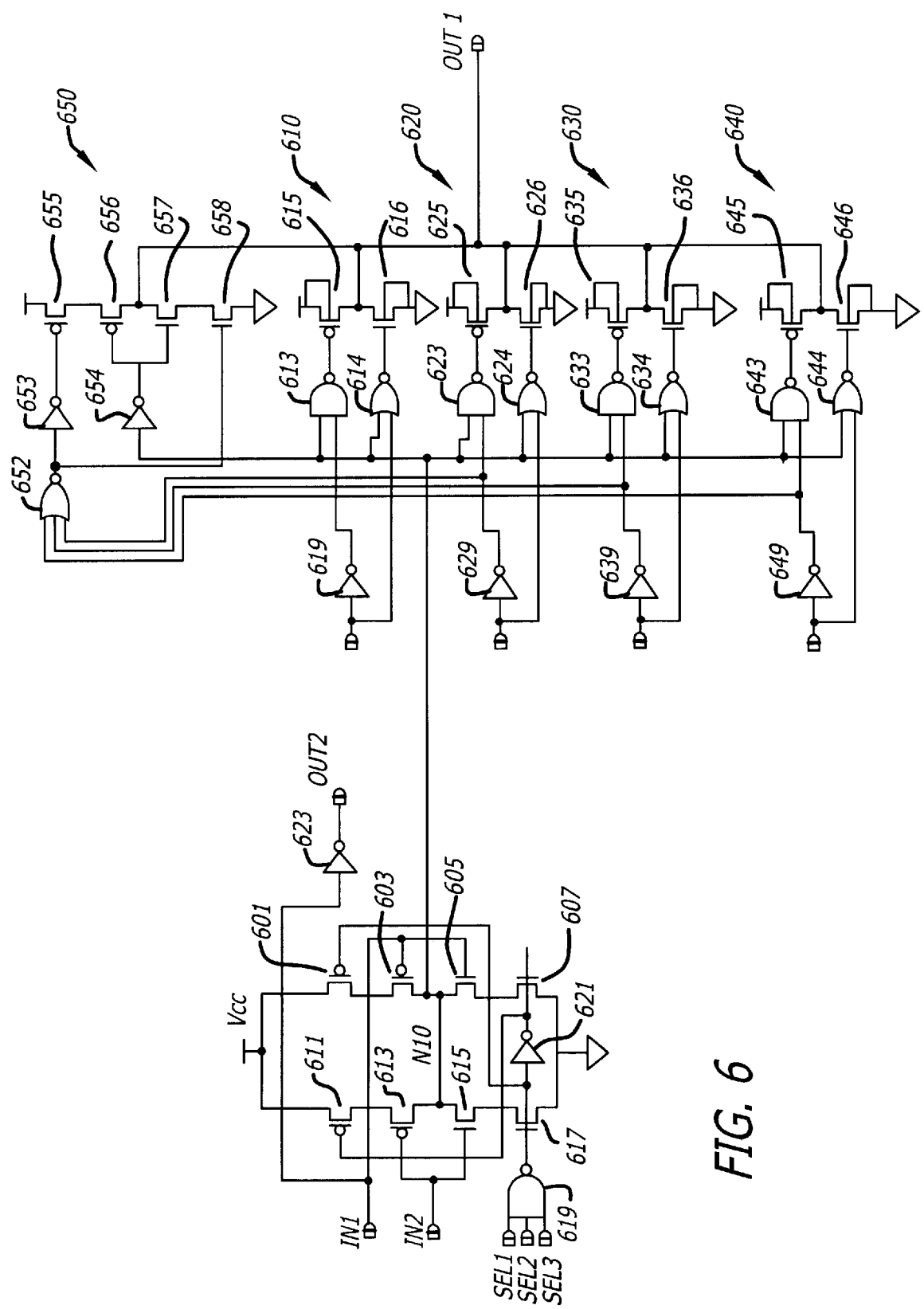
FIG. 6 shows a circuit diagram of one embodiment of a delay stage used to compensate for variations in a buffer's performance conditions.

FIG. 6 shows a circuit diagram of one embodiment of the PVT compensated delay stage 411A that is used to dynamically adjust the speed of the buffer based upon the variations in the performance conditions of the buffer (e.g., variations in manufacturing process, operating voltage and operating temperature).

In the embodiment shown in FIG. 6, the delay stage 411A includes a delay route control logic 610 that is used to control the routing of the input signal based upon the value of the first control input. As described above, in one embodiment, the first control input is used to specify a specific number of delay stages through which the input signal is to be routed in order to satisfy the timing equations requirements. In this embodiment, the first control input includes three selection bits sel1, sel2, and sel3, the value of which is used to specify a specific number of delay stages through which the input signal is to be routed. The delay route control logic 610 includes two inverter stacks that are coupled between Vcc and ground. The first inverter stack includes p-channel transistors 601 and 603 and n-channel transistors 605 and 607. The gates of the p-channel transistor 603 and the n-channel transistor 605 are coupled to the input node IN1 to receive the input signal and route the input signal to an internal node N10. The second inverter stack includes p-channel transistors 611 and 613 and n-channel transistors 615 and 617. The gates of the p-channel transistor 613 and the n-channel transistor 615 are coupled to the input node IN2 to receive the input signal from the second delay stage 411B and route the input signal to the internal node N10. The three selection bits of the first control input are inputted to a NAND gate 619. The output of the NAND gate 619 is connected to the gate of the p-channel transistor 601. The output of the NAND gate 619 is inverted by an inverter 621 and coupled to the gate of the p-channel transistor 611. The input node IN1 is also coupled to the output node OUT2 via an inverter 623.

In this embodiment, the delay stage 411A includes five signal paths 610, 620, 630, 640, and 650 that are connected in parallel between the internal node N10 and the output node OUT1. The signal path 610 includes a NAND gate 613, a NOR gate 614, a p-channel transistor 615, and an n-channel transistor 616. One of the inputs of the NOR gate 614 is connected to the internal node N10 to receive the input signal. The other input of the NOR gate 614 is coupled to compensation bit-1 of the second control input. One of the inputs of the NAND gate 613 is connected to the internal node N10 to receive the input signal. The other input of the NAND gate 613 is coupled to the invert of the compensation bit-1 of the second control input. The output of the NOR gate 614 is coupled to the gate of the n-channel transistor 616. The output of the NAND gate 613 is coupled to the gate of the p-channel transistor 615. The drain of the p-channel 615 and the source of the n-channel 616 are coupled to the output node OUT1.

The signal path 620 includes a NAND gate 623, a NOR gate 624, a p-channel transistor 625, and an n-channel transistor 626. One of the inputs of the NOR gate 624 is connected to the internal node N10 to receive the input signal. The other input of the NOR gate 624 is coupled to compensation bit-2 of the second control input. One of the inputs of the NAND gate 623 is connected to the internal node N10 to receive the input signal. The other input of the NAND gate 623 is coupled to the invert of the compensation bit-2 of the second control input. The output of the NOR gate 624 is coupled to the gate of the n-channel transistor 626. The output of the NAND gate 623 is coupled to the gate of the p-channel transistor 625. The drain of the p-channel 625 and the source of the n-channel 626 are coupled to the output node OUT1.

The signal path 630 includes a NAND gate 633, a NOR gate 634, a p-channel transistor 635, and an n-channel transistor 636. One of the inputs of the NOR gate 634 is connected to the internal node N10 to receive the input signal. The other input of the NOR gate 634 is coupled to compensation bit-3 of the second control input. One of the inputs of the NAND gate 633 is connected to the internal node N10 to receive the input signal. The other input of the NAND gate 633 is coupled to the invert of the compensation bit-3 of the second control input. The output of the NOR gate 634 is coupled to the gate of the n-channel transistor 636. The output of the NAND gate 633 is coupled to the gate of the p-channel transistor 635. The drain of the p-channel 635 and the source of the n-channel 636 are coupled to the output node OUT1.

The signal path 640 includes a NAND gate 643, a NOR gate 644, a p-channel transistor 645, and an n-channel transistor 646. One of the inputs of the NOR gate 644 is connected to the internal node N10 to receive the input signal. The other input of the NOR gate 644 is coupled to compensation bit-4 of the second control input. One of the inputs of the NAND gate 643 is connected to the internal node N10 to receive the input signal. The other input of the NAND gate 643 is coupled to the invert of the compensation bit-4 of the second control input. The output of the NOR gate 644 is coupled to the gate of the n-channel transistor 646. The output of the NAND gate 643 is coupled to the gate of the p-channel transistor 645. The drain of the p-channel 645 and the source of the n-channel 646 are coupled to the output node OUT1.

The signal path 650 includes two p-channel transistors 655 and 656, two n-channel transistors 657 and 658, two inverters 653 and 654. The input of the inverter 653 is coupled to the output of a NOR gate 652. The three inputs of the NOR gate 652 are coupled to the inverts of the three compensation bits 2, 3, and 4 of the second control input. The output of the inverter 653 is coupled to the gates of the p-channel transistor 655 and the n-channel transistor 658. The input of the inverter 654 is coupled to node N10. The output of the inverter 654 is coupled to the gates of the p-channel transistor 655 and the n-channel transistor 657. The source of the p-channel transistor 656 and the drain of the n-channel transistor 657 are coupled to a NAND gate 613, a NOR gate 614, a p-channel transistor 615, and an n-channel transistor 616. One of the inputs of the NOR gate 614 is connected to the internal node N10 to receive the input signal. The other input of the NOR gate 614 is coupled to compensation bit-1 of the second control input. One of the inputs of the NAND gate 613 is connected to the internal node N10 to receive the input signal. The other input of the NAND gate 613 is coupled to the invert of the compensation bit-1 of the second control input. The output of the NOR gate 614 is coupled to the gate of the n-channel transistor 616. The output of the NAND gate 613 is coupled to the gate of the p-channel transistor 615. The drain of the p-channel 615 and the source of the n-channel 616 are coupled to the output node OUT1.

In the embodiment shown in FIG. 6, each of the devices (e.g., the NAND gate, the NOR gate, the P-channel transistor, and the N-channel transistor, etc.) included in the parallel signal paths 610, 620, 630 and 640 are binary weighted so that the signal path 640 is the fastest path with the largest device sizes and the signal path 610 is the slowest path with the smallest device sizes. Specifically, the size of each device in the signal path 640 is about twice the size of the corresponding device in the signal path 630, about four times the size of the corresponding device in the signal path 620, and about eight times the size of the corresponding device in the signal path 610. Each of the four parallel paths 610, 620, 630, and 640 is activated (e.g., turned on) or deactivated (e.g., turned off) based upon the setting of the corresponding compensation bit of the second control input signal.

In the present embodiment, depending upon the settings of the three selection bits, the input signal can flow either from the input node IN1 to the internal node N10 directly without going through other delay stages or the input signal can flow from the input node IN1 to the output node OUT2 to go through other delay stages before reentering the first delay stage 411A via the input node IN2 and flow to the internal node N10. Regardless of the number of delay stages specified by the first control input, the input signal will always flow to the internal node N10 to go through the PVT compensated circuit in the first delay stage 411A to the output node OUT1.

Continuing with the present discussion, the input signal flows from the input node IN1 to the internal node N10 when the first control input is set to '000'. If the first control input is set to any value other than '000', the input signal flows from the input node IN1 to the output node OUT2 to be routed through a number of additional delay stages based upon the value of the first control input. In this case, after being routed through the additional delay stages, the input signal reenters the first delay stage 411A via the input node IN2 and then flows to the internal node N10. The input signal then moves from the internal node N10 to the output node OUT1 via one or more parallel signal paths 610–650, based upon the setting of the second control input. Each of the five parallel paths 610–650 is turned on or off according to the setting of the compensation bits (bit1–bit4). In the present embodiment, the compensation bits combinations range from 01000(LSB) in the FFFF corner to 10000(LSB) in the RSSS corner. In one embodiment, bit-0 (i.e., the least significant bit) is not used in the delay stage as the noise level nullifies its contribution. It can be appreciated from the combinations of the compensation bits that the signal will move slower in the FFFF corner and conversely will move faster in the RSSS corner through the first delay stage 411A. The delay of the input signal is therefore dynamically adjusted using the compensation bits corresponding to the PVT variations.

In the present embodiment, the signal path 650 is added to handle the cases where the compensation bits from the ICU are not normal due to any unpredictable reason (e.g., when compensation bits 4, 3, and 2 are all '000'). In this case, the input signal will flow from the internal node N10 to the output node OUT1 through the signal path 650. In one embodiment, the sizes of the devices in the signal path 650 are chosen to satisfy the timing requirements of the TTTT corner. The table below illustrates the various combinations of the compensation bits and the status of the corresponding signal paths.

| PVT Bit4 (MSB) | PVT Bit3 | PVT Bit2 | PVT Bit1 | PVT Bit0 (LSB) not used | Path 640 | Path 630 | Path 620 | Path 610 | Path 650 |
|---|---|---|---|---|---|---|---|---|---|
| 0 | 0 | 0 | X | X | OFF | OFF | OFF | OFF | ON |
| 0 | 1 | 0 | 0 | X | OFF | ON | OFF | OFF | OFF |
| 0 | 1 | 0 | 1 | X | OFF | ON | OFF | ON | OFF |
| 0 | 1 | 1 | 0 | X | OFF | ON | ON | OFF | OFF |
| 0 | 1 | 1 | 1 | X | OFF | ON | ON | ON | OFF |
| 1 | 0 | 0 | 0 | X | ON | OFF | OFF | OFF | OFF |
| 1 | 0 | 0 | 1 | X | ON | OFF | OFF | ON | OFF |
| 1 | 0 | 1 | 0 | X | ON | OFF | ON | OFF | OFF |
| 1 | 0 | 1 | 1 | X | ON | OFF | ON | ON | OFF |
| 1 | 1 | 0 | 0 | X | ON | ON | OFF | OFF | OFF |
| 1 | 1 | 0 | 1 | X | ON | ON | OFF | ON | OFF |
| 1 | 1 | 1 | 0 | X | ON | ON | ON | OFF | OFF |
| 1 | 1 | 1 | 1 | X | ON | ON | ON | ON | OFF |

Figure 7:
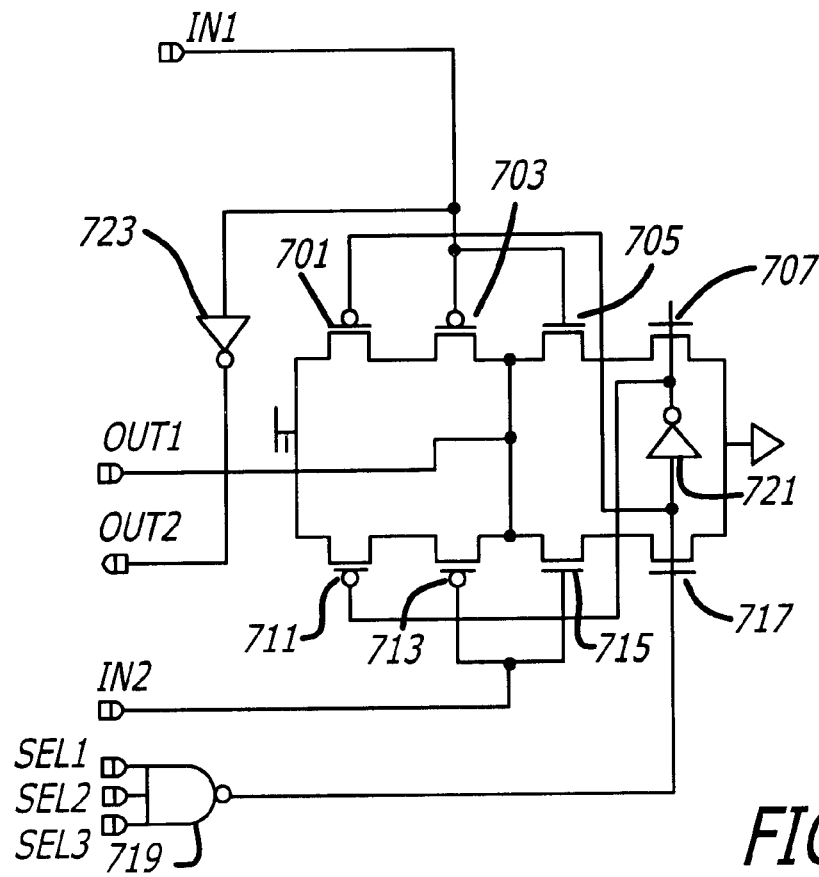
FIG. 7 shows a circuit diagram of one embodiment of a delay stage included in the delay unit in FIG. 4.

FIG. 7 illustrates a circuit diagram of one embodiment 700 of each of the delay stages 2 through 8 (i.e., delay stages 411B–411H in FIG. 4).

In the embodiment shown in FIG. 7, the delay stage 700 includes a delay route control logic 710 that is used to control the routing of the input signal based upon the value of the first control input. As described above, in one embodiment, the first control input is used to specify a specific number of delay stages through which the input signal is to be routed in order to satisfy the timing equations requirements. In this embodiment, the first control input includes three selection bits sel1, sel2, and sel3, the value of which is used to determine the routing path of the input signal through each of the delay stages. the delay route control logic 710 includes two inverter stacks that are coupled between Vcc and ground. The first inverter stack includes p-channel transistors 701 and 703 and n-channel transistors 705 and 707. The gates of the p-channel transistor 703 and the n-channel transistor 705 are coupled to the input node IN1 to receive the input signal from the previous delay stage and route the input signal to the output node OUT1. The second inverter stack includes p-channel transistors 711 and 713 and n-channel transistors 715 and 717. The gates of the p-channel transistor 713 and the n-channel transistor 715 are coupled to the input node IN2 to receive the input signal back from a subsequent stage and route the input signal to the output node OUT1 to be re-inputted to the previous delay stage. The three selection bits of the first control input are inputted to a NAND gate 719. The output of the NAND gate 719 is connected to the gate of the p-channel transistor 701. The output of the NAND gate 719 is inverted by an inverter 721 and coupled to the gate of the p-channel transistor 711. The input node IN1 is also coupled to the output node OUT2 via an inverter 723.

In operation, depending on the settings of the three selection bits, the input signal can be routed from the input node IN1 to the output node OUT2 in order to go through a subsequent delay stage or the input signal can be routed from the input node IN1 to the output node OUT1 in order to reenter a previous delay stage. For example, when the three selection bits are set to '001', the input signal will be routed through the first and the second delay stages as follows. The input signal will first flow from the input node IN1 of the first delay stage 411A to the output node OUT2 of the first delay stage 411A (FIG. 6). The input signal will then enter the second delay stage 411B at the input node IN1 (FIG. 7), flow to the output node OUT1 (FIG. 7), and reenter the first delay stage 411A via the second input node IN2 (FIG. 6) and then go through the PVT compensated circuit in the first delay stage 411A, as described above with respect to FIG. 6. Accordingly, the input signal can be routed through one or more delay stages based upon the settings of the three selection bits in order to satisfy the timing requirements. Regardless of the number of delay stages selected, the input signal will always go through the PVT compensated circuit in the first delay stage 411A. As such, the delay of the input signal can be dynamically adjusted based upon the setting of the compensation bits that correspond to the different PVT variations.

The invention has been described in conjunction with the preferred embodiment. It is evident that numerous alternatives, modifications, variations and uses will be apparent to those skilled in the art in light of the foregoing description.

What is claimed is:

1. A method comprising:

receiving an input signal at a first node of a buffer; and adjustably delaying the propagation of the input signal from the first node to a second node through one or more delay stages based upon a first control input and a second control input, the one or more delay stages including at least one delay stage having a plurality of signal paths connected in parallel, each of the signal paths having a different size to allow a corresponding current level of the input signal to flow through the respective signal path when the respective signal path is activated.

2. The method of claim 1 wherein the second control input corresponds to variations in the buffer's performance parameters.

3. The method of claim 2 wherein variations in the buffer's performance parameters include variations in manufacturing process, variations in operating voltage, and variations in operating temperature.

4. The method of claim 1 wherein receiving the input signal comprises:

latching the input signal in response to a clock signal.

5. The method of claim 1 wherein delaying the propagation of the input signal comprises:

routing the input signal through the one or more delay stages based upon the value of the first control input.

6. The method of claim 5 wherein the first control input comprises at least one control bit the value of which is used to determine a corresponding number of delay stages through which the input signal is to be routed.

7. The method of claim 5 wherein the first control input comprises at least two control bits the value of which is used to determine a corresponding number of delay stages through the input signal is to be routed.

8. The method of claim 5 wherein the first control input comprises at least three control bits the value of which is used to determine a corresponding number of delay stages through the input signal is to be routed.

9. The method of claim 5 wherein routing comprises:
activating the one or more delay stages based upon the value of the first control input.

10. The method of claim 9 wherein each delay stage comprises at least one switching device that is turned on to activate or turned off to deactivate the respective delay stage, based upon the value of the first control input.

11. The method of claim 1 wherein each signal path of the at least one delay stage is activated or deactivated based on the value of the second control input.

12. A buffer circuit comprising:
a delay unit to adjustably delay the propagation of an input signal from a first node to a second node in the buffer circuit based upon a first control signal corresponding to a selected delay period and a second control signal corresponding to variations in the performance conditions of the buffer circuit, the delay unit including one or more delay stages, the one or more delay stages including at least one delay stage having a plurality of signal paths connected in parallel, each of the signal paths having a different size to allow a corresponding current level of the input signal to flow through the respective signal path when the respective signal path is activated.

13. The buffer circuit of claim 12 wherein the variations in the performance conditions include variations in manufacturing process, variations in operating voltage, and variations in operating temperature.

14. The buffer circuit of claim 12 wherein each of the one or more delay stages is activated or deactivated based upon the value of the first control signal to provide a corresponding delay time.

15. The buffer circuit of claim 14 wherein each signal path of the at least one delay stage is activated or deactivated based upon the value of the second control signal.

16. The buffer circuit of claim 15 wherein the corresponding current level of the input signal allowed to pass through each activated signal path is proportionate to the size of the respective signal path.

17. The buffer circuit of claim 16 wherein a larger signal path allows a higher level of current of the input signal to pass through.

18. The buffer circuit of claim 15 wherein the number of signal paths connected between the first node and the second node corresponds to the number of control bits included in the second control signal.

19. The buffer circuit of claim 18 wherein the value of each control bit is used to activate or deactivate a corresponding signal path.

20. A buffer circuit comprising:
a delay unit to adjustably delay the propagation of an input signal from a first node to a second node in the buffer circuit based upon a first control signal corresponding to a selected delay period and a second control signal corresponding to variations in the performance conditions of the buffer circuit, the delay unit comprising:
a plurality of delay stages each being activated or deactivated based upon the value of the first control signal, the input signal being routed through each activated delay stage to provide a corresponding delay time, at least one delay stage being used to adjust the selected delay period based upon the value of the second control signal, the at least one delay stage comprising:
a plurality of signal paths having different sizes connected in parallel between the first node and the second node of the buffer circuit, each signal path being activated or deactivated based upon the value of the second control signal, each signal path when activated allowing a corresponding current level of the input signal to pass from the first node to the second node through the respective signal path, the number of signal paths connected between the first node and the second node corresponding to the number of control bits included in the second control signal, the value of each control bit being used to activate or deactivate a corresponding signal path, the plurality of signal paths comprising:
a first signal path having a first size coupled between the first node and the second node, the first signal path coupled to receive a first control bit of the control signal;
a second signal path having a second size coupled between the first node and the second node in parallel with the first signal path, the second signal path coupled to receive a second control bit of the control signal;
a third signal path having a third size coupled between the first node and the second node in parallel with the first signal path, the third signal path coupled to receive a third control bit of the control signal; and
a fourth signal path having a fourth size coupled between the first node and the second node in parallel with the first signal path, the fourth signal path coupled to receive the fourth control bit of the control signal.

21. A buffer circuit comprising:
a delay unit to adjustably delay the propagation of an input signal from a first node to a second node in the buffer circuit based upon a first control signal corresponding to a selected delay period and a second control signal corresponding to variations in the performance conditions of the buffer circuit, wherein the delay unit comprises:
a plurality of delay stages each being activated or deactivated based upon the value of the first control signal, the input signal being routed through each activated delay stage to provide a corresponding delay time, wherein at least one delay stage is used to adjust the selected delay period based upon the value of the second control signal, the at least one delay stage comprising:
a plurality of signal paths having different sizes connected in parallel between the first node and the second node of the buffer circuit, each signal path being activated or deactivated based upon the value of the second control signal, each signal path when activated allowing a corresponding current level of the input signal to pass from the first node to the second node through the respective signal path, wherein each signal path comprises:
- a NOR gate having a first input and a second input, the first input being coupled to the input signal, the second input being coupled to a corresponding control bit of the second control signal;
- a NAND gate having a first input and a second input, the first input being coupled to the input signal, the second input being coupled to the invert of the corresponding control bit;
- an N type field effect transistor having a first terminal, a second terminal, and a gate, the gate being coupled to the output of the NOR gate, the first terminal being coupled to the second node, the second terminal being coupled to ground level; and
- a P type field effect transistor having a first terminal, a second terminal, and a gate, the gate being coupled to the output of the NAND gate, the first terminal being coupled to a first voltage and the second terminal being coupled to the first terminal of the N type field effect transistor.

22. A buffer circuit comprising:

an input latch to latch an input signal in response to a clock signal;

a delay circuit to adjustably delay the propagation of the input signal from a first node to a second node in the buffer circuit based upon a first control signal corresponding to a selected delay period and a second control signal corresponding to variations in the performance conditions of the buffer circuit, the delay circuit including one or more delay stages, the one or more delay stages including at least one delay stage having a plurality of signal paths connected in parallel, each of the signal paths having a specific size to allow a corresponding current level of the input signal to pass through the respective signal path when the respective signal path is activated;

a pre-driver circuit coupled to the delay circuit; and a driver circuit coupled to the pre-driver circuit.

23. A processor comprising:

a buffer circuit to facilitate data transfer between the processor and another device, the buffer circuit comprising:
  a delay circuit to adjustably delay the propagation of a signal from a first node to a second node in the buffer circuit based upon a first control input corresponding to a selected delay period and a second control input corresponding to variations in the performance conditions of the buffer circuit, the delay circuit including one or more delay stages, the one or more delay stages including at least one delay stage having a plurality of signal paths connected in parallel, each of the signal paths having a specific size to allow a corresponding current level of the input signal to flow through the respective signal path when the respective signal path is activated.

24. The processor of claim 23 wherein each delay stage is activated or deactivated based upon the value of the first control input and wherein each signal path of the at least one delay stage is activated or deactivated based upon the value of the second control input.

\* \* \* \* \*

UNITED STATES PATENT AND TRADEMARK OFFICE
CERTIFICATE OF CORRECTION

PATENT NO. : 6,566,903 B1 Page 1 of 1
DATED : May 20, 2003
INVENTOR(S) : Mandal et al.

It is certified that error appears in the above-identified patent and that said Letters Patent is hereby corrected as shown below:

Column 3,
Line 10, after "chipset", insert -- unit --.

Column 5,
Line 24, delete "routted", insert -- routed --.
Line 26, delete "imputted", insert -- inputted --.

Signed and Sealed this

Thirtieth Day of March, 2004

JON W. DUDAS
*Acting Director of the United States Patent and Trademark Office*